(12) United States Patent
Malkov (10) Patent No.: US 9,484,922 B2
(45) Date of Patent: Nov. 1, 2016

(54) VOLTAGE LEVEL SHIFTER MODULE

(71) Applicant: Andrey Evgenevich Malkov, Zelenograd (RU)

(72) Inventor: Andrey Evgenevich Malkov, Zelenograd (RU)

(73) Assignee: Freescale Semiconductor, Inc., Eindhoven (NL)

( * ) Notice: Subject to any disclaimer, the term of this patent is extended or adjusted under 35 U.S.C. 154(b) by 90 days.

(21) Appl. No.: 14/516,656

(22) Filed: Oct. 17, 2014

(65) Prior Publication Data

US 2015/0295561 A1  Oct. 15, 2015

(30) Foreign Application Priority Data

Apr. 10, 2014 (RU) ................................ 2014115003

(51) Int. Cl.

| | |
|---|---|
| *H03K 19/018* | (2006.01) |
| *H03K 19/0185* | (2006.01) |
| *H03K 3/356* | (2006.01) |
| *H03K 5/06* | (2006.01) |
| *H03K 5/15* | (2006.01) |
| *H03K 5/1534* | (2006.01) |

(52) U.S. Cl.
CPC .. *H03K 19/018507* (2013.01); *H03K 3/35613* (2013.01); *H03K 5/06* (2013.01); *H03K 5/15* (2013.01); *H03K 5/1534* (2013.01); *H03K 5/15086* (2013.01)

(58) Field of Classification Search
CPC ............... H03K 19/018507; H03K 19/01806; H03K 19/01812
USPC ..................................... 327/333; 326/80, 81
See application file for complete search history.

(56) References Cited

U.S. PATENT DOCUMENTS

| | | | |
|---|---|---|---|
| 5,969,542 A | 10/1999 | Maley et al. | |
| 2010/0127752 A1* | 5/2010 | Fort ................. | H03K 3/356113 327/333 |

* cited by examiner

*Primary Examiner* — Kenneth B Wells (57) ABSTRACT

A voltage level shifter module comprising at least one input arranged to receive an input signal, and at least one cascode transistor arranged to receive at a gate thereof at least one reference voltage signal. The voltage level shifter module further comprises at least one reference voltage control component arranged to detect logical state transitions within the input signal from at least a first logical state to a second logical state, and cause the reference voltage signal applied to the gate of the at least one cascode transistor to be pulled down to a reduced voltage upon detection of a logical state transition within the input signal from at least a first logical state to a second logical state.

14 Claims, 7 Drawing Sheets

VOLTAGE LEVEL SHIFTER MODULE

CROSS REFERENCE TO RELATED APPLICATION(S)

The present application claims priority to Russian Patent Application No. 2014115003, entitled "VOLTAGE LEVEL SHIFTER MODULE," filed on Apr. 16, 2014, the entirety of which is herein incorporated by reference.

FIELD OF THE INVENTION

This invention relates to a voltage level shifter module.

BACKGROUND OF THE INVENTION

In the field of digital electronics, digital circuits operating at a first voltage level are often required to communicate within digital circuits operating at a different voltage level. For example, a first digital circuit within, say, a very large scale integrated (VLSI) circuit device, may be arranged to operate at a first voltage level. For example, such a first digital circuit may operate between a low power supply voltage of, say, 0V (e.g. a ground plane) and a high power supply voltage of, say, 2V. As such, this first digital circuit may operate at a 2V voltage level, with logic signals for this digital circuit existing at 0V for a low logical state and 2V for a high logical state. This first digital circuit may be required to communicate with (i.e. send and receive digital signals to and from) a second digital circuit. Such a second digital circuit may be external to the VLSI circuit device comprising the first digital circuit, and may be operating at a second voltage level. For example, such a second digital circuit may operate between a low power supply voltage of, say, 0V (e.g. a ground plane) and a high power supply voltage of, say, 3.3V. As such, this second digital circuit may operate at a 3.3V voltage level, with logic signals for this digital circuit existing at 0V for a low logical state and 3.3V for a high logical state. In order for two such digital circuits operating at different voltage levels to be able to communicate, a voltage conversion or translation is required for signals between the two digital circuits. Such voltage conversion/translation is typically performed by a voltage level shifter module circuit.

Figure 1:
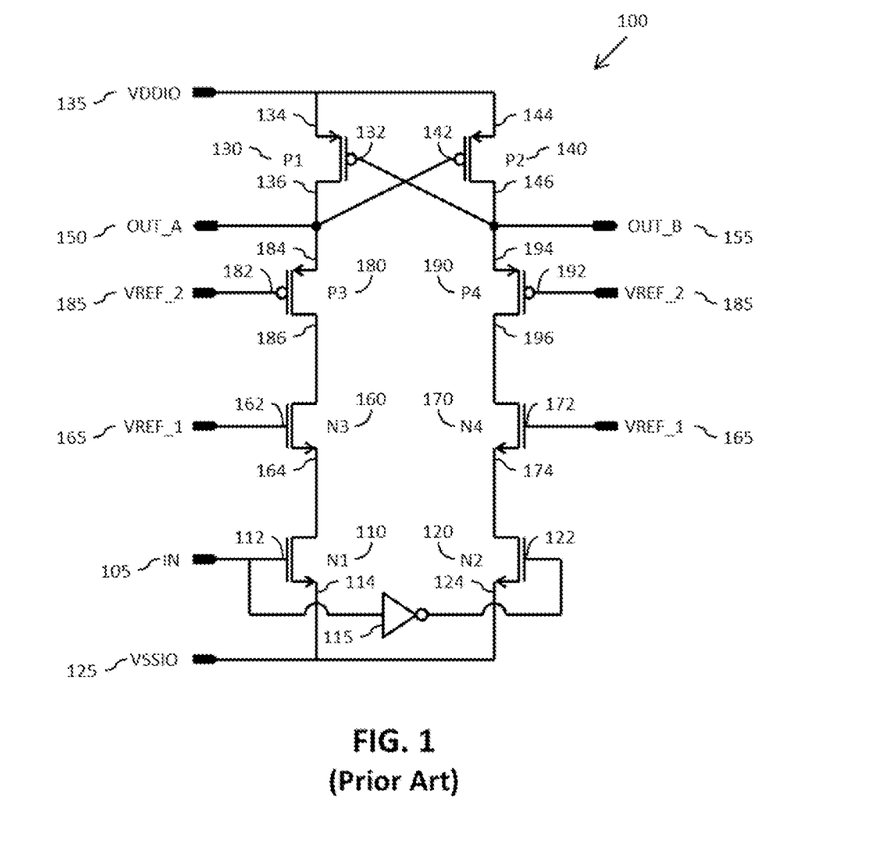
FIG. 1 illustrates a simplified circuit diagram of an example of a conventional voltage level shifter module circuit.

FIG. 1 illustrates a simplified circuit diagram of an example of a conventional voltage level shifter module circuit 100 arranged to convert a lower voltage digital signal received at an input thereof to an equivalent higher voltage digital signal output thereby. The voltage level shifter module circuit 100 comprises a first pair of input N-channel metal oxide semiconductor (NMOS) transistors N1 110 and N2 120. A gate 112 of the first input NMOS transistor N1 110 is operably coupled substantially directly to an input 105 of the voltage level shifter module circuit 100. A gate 122 of the second input NMOS transistor N2 120 is operably coupled to the input 105 of the voltage level shifter module circuit 100 via an inverter 115. Sources 114, 124 of the first and second input NMOS transistors N1 110, N2 120 are operably coupled to a low voltage power supply VSSIO 125.

The voltage level shifter module circuit 100 further comprises a pair of cross-coupled P-channel metal oxide semiconductor (PMOS) transistors P1 130, P2 140. Sources 134, 144 of the cross-coupled PMOS transistors P1 130, P2 140 are operably coupled to a high voltage power supply VDDIO 135. Drains 136, 146 of the cross-coupled PMOS transistors P1 130, P2 140 are operably coupled to differential output nodes 150, 155 respectively of the voltage level shifter module circuit 100. A gate 132 of the first cross-coupled PMOS transistor 130 is operably coupled to a first of the differential output nodes 155, to which the drain of the second cross-coupled PMOS transistor is also operably coupled. A gate 142 of the second cross-coupled PMOS transistor 140 is operably coupled to a second of the differential output nodes 150, to which the drain of the first cross-coupled PMOS transistor is also operably coupled.

The voltage level shifter module circuit 100 illustrated in FIG. 1 further comprises a pair of cascode NMOS transistors N3 160, N4 170 and a pair of cascode PMOS transistors P3 180, P4 190. The cascode transistor pairs are operably coupled between the input NMOS transistors N1 110, N2 120 and the cross-coupled PMOS transistors P1 130, P2 140, and ensure the voltages across the terminals of the various transistors within the voltage level shifter module circuit 100 remain within the technology limits for the thickness of the transistor gate oxides, as is well known in the art. Thus, the voltage level shifter module 100 consists of two branches of transistors that are differentially switched. The first branch of transistors comprises the NMOS transistors N1 110 and N3 160 and the PMOS transistors P3 180 and P1 130. The second branch of transistors comprises the NMOS transistors N2 120 and N4 170 and the PMOS transistors P4 190 and P2 140.

In an ideal scenario, the power supplies VSSIO 125 and VDDIO 135 are arranged to comprise voltages of, say, 0V and 3.3V respectively, whilst the input signal 105 is generated by a digital circuit operating at a 2V voltage level, with logic signals for the input signal 105 comprising 0V for a low logical state and 2V for a high logical state. The gates 162, 172 of the cascode NMOS transistors N3 160, N4 170 are operably coupled to a reference voltage signal VREF_1 165, whilst the gates 182, 192 of the cascode PMOS transistors P3 180, P4 190 are operably coupled to a reference voltage signal VREF_2 185. The reference voltage signals VREF_2 185 and VREF_1 165 comprise voltage levels between the power supplies VSSIO 125 and VDDIO 135, such equal to VDDIO/2. Accordingly, in this ideal scenario the reference voltage signals VREF_2 185 and VREF_1 165 comprise voltages of 1.65V.

The voltage level shifter module circuit 100 operates as follows. Assuming the input 105 comprises a high logical level of 2V, the input NMOS transistor N1 110 is driven into a conductive state by the high input signal 105, which pulls the source 164 of the cascode NMOS transistor N3 160 down to VSSIO 125. At the same time, the input NMOS transistor N2 120 is driven into a non-conductive state by the low inverted input signal output by the inverter 115. This results in the source 174 of the cascode NMOS transistor N4 170 charging up to VREF_1 165. Since the gate voltages of the cascode NMOS transistors N3 160, N4 170 are held at VREF_1 165, the cascode NMOS transistors N3 160, N4 170 are driven into conductive and non-conductive states respectively. As a result, the drain 186 of the cascode PMOS transistor P3 180 is pulled down to VSSIO 125, whilst the drain 196 of the cascode PMOS transistor P4 190 is charged up to VDDIO 135. Since the gate voltages of the cascode PMOS transistors P3 180, P4 190 are held at VREF_2 185, voltages at the sources 184, 194 of the cascode PMOS transistors P3 180, P4 190 will not drop below VREF_2 185. The cross-coupled PMOS transistors P1 130, P2 140 operate in a similar manner to a current sense circuit. As such, the output node 150 to which the source 184 of cascode PMOS transistor P3 180, the drain 136 of the cross-coupled PMOS transistors P1 130 and the gate 142 of the cross-coupled PMOS transistor P2 140 are operably coupled is discharged until it reaches: VREF_2+|$V_{Pth}$|, $V_{Pth}$ being the threshold voltage for the PMOS transistors. This discharging of the output node 150 drives the cross-coupled PMOS transistor P2 140 into a conductive state, which charges the output node 155 to which the source 194 of cascode PMOS transistor P4 190, the drain 146 of the cross-coupled PMOS transistors P2 140 and the gate 132 of the cross-coupled PMOS transistor P1 130 are operably coupled to VDDIO 135. This charging of the output node 155 to VDDIO 135 drives the cross-coupled PMOS transistor P1 130 into a non-conductive state. The reverse of the above described operation of the voltage level shifter module circuit 100 occurs when the input 105 comprises a low logical level of 0V.

With a typical +/−10% tolerance margin a minimum permissible voltage for VDDIO 135 is 3.0V. However, the performance (timing delays, rise/fall delay difference) of such a conventional voltage level shifter module circuit 100 degrades drastically when VDDIO 135 drops to 3.0V. The reason for such performance degradation is as follows. When VDDIO=3.0V, VREF_2=VDDIO/2=1.5v. When the input 105 transitions from, say, 0V to 2V, the output node 150 is discharged until it reaches: VREF_2+|$V_{Pth}$|, $V_{Pth}$ being the threshold voltage for the PMOS transistors and typically equal to around 0.75V. Thus, when VDDIO 135 is 3.0V, the output node 150 discharges to 1.5V+0.75V=2.25V. This 2.25V is applied to the gate 142 of the PMOS transistor P2 140. Since the source 144 of the PMOS transistor P2 140 is tied to VDDIO 135, $V_{GS}$ for the PMOS transistor P2 140=3.0V−2.25V=0.75V. Thus, as can be seen, when VDDIO 135 is 3.0V the voltage applied to the gate 142 of the PMOS transistor P2 140 when the input 105 transitions from 0V to 2V is only sufficient to drive the PMOS transistor P2 140 into its sub-threshold region of operation, with very low drive capability.

Such poor performance when VDDIO 135 is at or near its minimum permissible voltage of 3.0V prevents high speed operation of the voltage level shifter module circuit 100 under such permitted operating conditions.

SUMMARY OF THE INVENTION

The present invention provides a voltage level shifter module and a method of controlling at least one reference voltage signal applied to a gate of at least one cascode transistor within a voltage level shifter module as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

The present invention will now be described with reference to the accompanying drawings. However, it will be appreciated that the present invention is not limited to the specific examples herein described and illustrated in the accompanying drawings. For example, the present invention is not limited to the specific examples of voltage level shifter circuitry used herein to illustrated and describe embodiments of the invention, and it will be apparent that the present invention may equally be implemented with other examples of voltage level shifter circuitry.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

In accordance with some examples of a first aspect of the present invention, there is provided a voltage level shifter module comprising at least one input arranged to receive an input signal, and at least one cascode transistor arranged to receive at a gate thereof at least one reference voltage signal. The voltage level shifter module further comprises at least one reference voltage control component arranged to detect logical state transitions within the input signal from at least a first logical state to a second logical state, and cause the reference voltage signal applied to the gate of the at least one cascode transistor to be pulled down to a reduced voltage upon detection of a logical state transition within the input signal from at least a first logical state to a second logical state.

In this manner, and as described in greater detail below, by causing the gate voltage of a transistor within the cascode transistor to be pulled down to a reduced voltage, an improved drive capability of an output stage of the voltage level shifter may be achieved when a power supply for the voltage level shifter is at or near its minimum permissible voltage.

According to some optional embodiments of the present invention, the at least one reference voltage control component may be arranged to cause the at least one reference voltage signal applied at the gate of the at least one cascode transistor to be pulled down to a reduced voltage upon detection of a logical state transition within the input signal from at least a first logical state to a second logical state for a limited period of time.

According to some optional embodiments of the present invention, the at least one reference voltage control component may comprise at least one transition detector component arranged to receive the input signal, detect logical state transitions within the input signal from at least a first logical state to a second logical state, and output at least one transition detection signal indicating when a logical state transition within the input signal from at least a first logical state to a second logical state has been detected.

According to some optional embodiments of the present invention, the at least one reference voltage control component further may comprise at least one reference voltage control circuit comprising at least one resistive element operably coupled between a reference voltage source and the gate of the at least one cascode transistor, and at least one switching element arranged to selectively couple the gate of the at least one cascode transistor to a reduced voltage source, the at least one switching element being further arranged to receive that at least one transition detection signal output by the at least one transition detector component and controllable by the at least one transition detection signal to selectively couple the gate of the at least one cascode transistor to a reduced voltage source.

According to some optional embodiments of the present invention, the at least one resistive element operably coupled between a reference voltage source and the gate of the at least one cascode transistor may comprise an N-channel metal oxide field effect transistor. In some examples, a voltage equal to the reference voltage source plus a threshold voltage for the N-channel metal oxide field effect transistor may be applied to a gate of the N-channel metal oxide field effect transistor.

According to some optional embodiments of the present invention, the at least one transition detector component is arranged to generate an inverted and delayed form of the input signal and comprises at least one of:
an AND gate arranged to receive the input signal and the inverted and delayed form of the input signal and to output a logical high pulse upon a transition of the input signal from a low logical state to a high logical state; and
a NAND gate arranged to receive the input signal and the inverted and delayed form of the input signal and to output a logical high pulse upon a transition of the input signal from a high logical state to a low logical state According to some optional embodiments of the present invention, the voltage level shifter module may comprise a differential voltage level shifter module comprising at least a first pair of cascode transistors, the at least first pair of cascode transistors comprising a first transistor operably coupled within a first branch of the differential voltage level shifter module and arranged to receive at a gate thereof a first reference voltage signal, and a second transistor operably coupled within a second branch of the differential voltage level shifter module and arranged to receive at a gate thereof a second reference voltage signal. The at least one reference voltage control component may be arranged to cause the first reference voltage signal applied at the gate of the first transistor to be pulled down to a reduced voltage upon detection of a logical state transition within the input signal from a first logical state to a second logical state, and cause the second reference voltage signal applied at the gate of the second cascode transistor to be pulled down to a reduced voltage upon detection of a logical state transition within the input signal from a second logical state to a first logical state.

According to some optional embodiments of the present invention, the voltage level shifter module may be implemented within an integrated circuit device comprising at least one die within a single integrated circuit package.

In accordance with some examples of a second aspect of the present invention, there is provided a method of controlling at least one reference voltage signal applied to a gate of at least one cascode transistor within a voltage level shifter module. The method comprises receiving an input signal of the voltage level shifter module, detecting a logical state transition within the input signal of the voltage level shifter module, and causing the at least one reference voltage signal to be pulled down to a reduced voltage upon detection of a logical state transition within the signal of the voltage level shifter module.

According to some optional embodiments of the present invention, the method may comprise causing a first reference voltage signal to be pulled down to a reduced voltage upon detection of a logical state transition within the input signal from a first logical state to a second logical state, the first reference voltage being applied at a gate of a first cascode transistor operably coupled within a first branch of a differential voltage level shifter module, and causing a second reference voltage signal to be pulled down to a reduced voltage upon detection of a logical state transition within the input signal from a second logical state to a first logical state, the second reference voltage being applied at a gate of a second cascode transistor operably coupled within a second branch of the differential voltage level shifter module.

Figure 2:
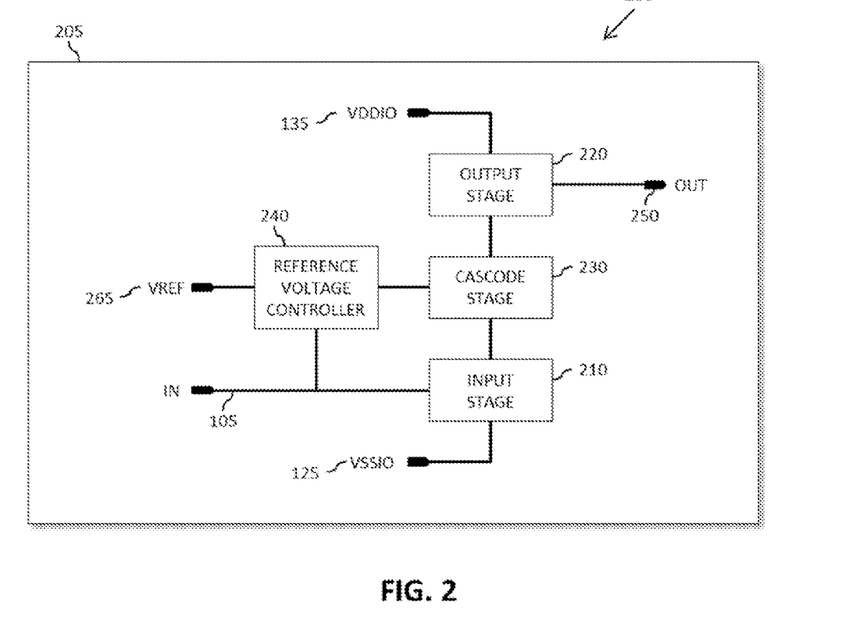
FIG. 2 illustrates a simplified block diagram of an example of a voltage level shifter module.

Referring now to FIG. 2, there is illustrated a simplified block diagram of an example of a voltage level shifter module 200. In some examples, the voltage level shifter module 200 may be implemented within an integrated circuit device 205 comprising at least one die within a single integrated circuit package. The voltage level shifter module 200 comprises an input stage 210 arranged to receive an input signal 105 for the voltage level shifter module 200. The input stage 210 may comprise one or more input transistors, and the input signal 205 is arranged to be applied to a gate of the, or at least one of the, input transistors. The voltage level shifter module 200 further comprises an output stage 220 comprising one or more output transistors arranged to drive an output signal 250, and a cascode stage 230 comprising one or more transistors operably coupled between the transistors of the input stage 210 and the transistors of the output stage 220 and arranged to ensure the voltages across the terminals of the various transistors within the voltage level shifter module circuit 200 remain within the technology limits for the thickness of the transistor gate oxides, as is well known in the art. The input stage 210, cascode stage 230 and output stage 220 of the voltage level shifter module 200 are operably coupled in series between a low voltage power supply VSSIO 125, for example a 0V power supply, and a high voltage power supply, for example a (nominally) 3.3V power supply. A reference voltage VREF 265 is arranged to be applied to the gate of one or more of the transistors within the cascode stage 230.

As described in the background of the invention, with a typical +/−10% tolerance margin a minimum permissible voltage for a 3.3V power supply VDDIO 135 is 3.0V. However, the performance of a conventional voltage level shifter module circuit, such as the voltage level shifter module 100 illustrated in FIG. 1, degrades drastically when VDDIO 135 drops to 3.0V due to the transistors within the output stage only being biased into their sub-threshold regions of operation, with very low drive capability.

The voltage level shifter module 200 illustrated in FIG. 2 comprises a reference voltage control component 240. The voltage control component 240 is arranged to detect logical state transitions within the input signal 105 from at least a first logical state to a second logical state, and to cause the reference voltage signal 265 applied to the gate of one or more of the transistors within the cascode stage 230 to be pulled down to a reduced voltage upon detection of a logical state transition within the input signal from at least a first logical state to a second logical state. In this manner, and as described in greater detail below, by causing the gate voltage of a transistor within the cascode stage 230 to be pulled down to a reduced voltage, an improved drive capability of the output stage 220 may be achieved when the power supply VDDIO 135 is only 3.0V.

Figure 3:
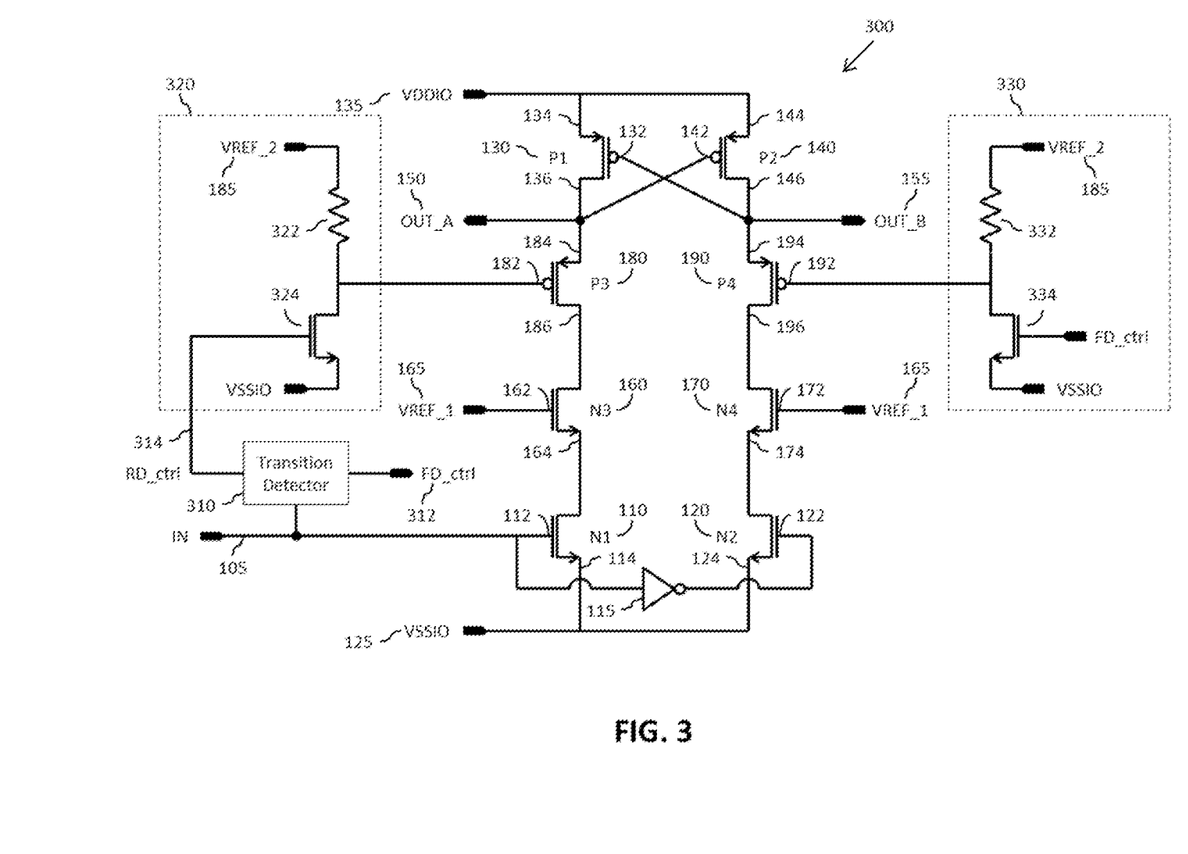
FIG. 3 illustrates a simplified circuit diagram of an alternative example of a voltage level shifter module.

Referring now to FIG. 3 there is illustrated a simplified circuit diagram of an example of a voltage level shifter module 300. In the example illustrated in FIG. 3 there is illustrated a differential voltage level shifter module 300 arranged to convert a lower voltage digital signal received at an input thereof to an equivalent higher voltage differential digital signal output thereby. The voltage level shifter module circuit 300 comprises a first pair of input N-channel metal oxide semiconductor (NMOS) transistors N1 110 and N2 120. A gate 112 of the first input NMOS transistor N1 110 is operably coupled substantially directly to an input of the voltage level shifter module circuit 300 and arranged to receive an input signal 105. A gate 122 of the second input NMOS transistor N2 120 is operably coupled to the input of the voltage level shifter module circuit 300 via an inverter 115 and arranged to receive an inverted equivalent of the input signal 105. Sources 114, 124 of the first and second input NMOS transistors N1 110, N2 120 are operably coupled to a low voltage power supply VSSIO 125.

The voltage level shifter module circuit 300 further comprises a pair of cross-coupled P-channel metal oxide semiconductor (PMOS) transistors P1 130, P2 140. Sources 134, 144 of the cross-coupled PMOS transistors P1 130, P2 140 are operably coupled to a high voltage power supply VDDIO 135. Drains 136, 146 of the cross-coupled PMOS transistors P1 130, P2 140 are operably coupled to differential output nodes 150, 155 respectively of the voltage level shifter module circuit 300. A gate 132 of the first cross-coupled PMOS transistor 130 is operably coupled to a first of the differential output nodes 155, to which the drain 146 of the second cross-coupled PMOS transistor 140 is also operably coupled. A gate 142 of the second cross-coupled PMOS transistor 140 is operably coupled to a second of the differential output nodes 150, to which the drain 136 of the first cross-coupled PMOS transistor 130 is also operably coupled.

The voltage level shifter module circuit 300 illustrated in FIG. 3 further comprises a pair of cascode NMOS transistors N3 160, N4 170 and a pair of cascode PMOS transistors P3 180, P4 190. The cascode transistor pairs are operably coupled between the input NMOS transistors N1 110, N2 120 and the cross-coupled PMOS transistors P1 130, P2 140. Thus, the voltage level shifter module 300 consists of two branches of transistors that are differentially switched. The first branch of transistors comprises the NMOS transistors N1 110 and N3 160 and the PMOS transistors P3 180 and P1 130. The second branch of transistors comprises the NMOS transistors N2 120 and N4 170 and the PMOS transistors P4 190 and P2 140.

In an ideal scenario, the power supplies VSSIO 125 and VDDIO 135 are arranged to comprise voltages of, say, 0V and 3.3V respectively, whilst the input signal 105 is generated by a digital circuit (not shown) operating at a 2V voltage level, with logic signals for the input signal 105 comprising 0V for a low logical state and 2V for a high logical state. A first reference voltage signal VREF_1 165 is arranged to be applied to the gates 162, 172 of the cascode NMOS transistors N3 160, N4 170, whilst a second reference voltage signal VREF_2 185 is arranged to be applied to the gates 182, 192 of the cascode PMOS transistors P3 180, P4 190. The reference voltage signals VREF_2 185 and VREF_1 165 comprise voltage levels between the power supplies VSSIO 125 and VDDIO 135, such equal to VDDIO/2. Accordingly, in this ideal scenario the reference voltage signals VREF_2 185 and VREF_1 165 may each comprise voltages of 1.65V.

In the case where the input 105 comprises a high logical level of 2V, the input NMOS transistor N1 110 is driven into a conductive state by the high input signal 105, which pulls the source 164 of the cascode NMOS transistor N3 160 down to VSSIO 125. At the same time, the input NMOS transistor N2 120 is driven into a non-conductive state by the low inverted input signal output by the inverter 115. This results in the source 174 of the cascode NMOS transistor N4 170 charging up to the reference voltage applied to the gate of cascode NMOS transistor N4 170. In the example illustrated in FIG. 3, the gate voltages of the cascode NMOS transistors N3 160, N4 170 are held at VREF1_165, and so the cascode NMOS transistors N3 160, N4 170 are driven into conductive and non-conductive states respectively. As a result, the drain 186 of the cascode PMOS transistor P3 180 is pulled down to VSSIO 125, whilst the drain 196 of the cascode PMOS transistor P4 190 is charged up to VDDIO 135. If the gate voltages of the cascode PMOS transistors P3 180, P4 190 are held at VREF_2 185, voltages at the sources 184, 194 of the cascode PMOS transistors P3 180, P4 190 will not drop below VREF_2 185. The cross-coupled PMOS transistors P1 130, P2 140 operate in a similar manner to a current sense circuit. As such, the output node 150 to which the source 184 of cascode PMOS transistor P3 180, the drain 136 of the cross-coupled PMOS transistors P1 130 and the gate 142 of the cross-coupled PMOS transistor P2 140 are operably coupled is discharged until it reaches: $V_{G\_P3} + |V_{Pth}|$, where $V_{G\_P3}$ is the gate voltage for the cascode PMOS transistor P3 180 and $V_{Pth}$ is the threshold voltage for the PMOS transistors. In the ideal scenario, this discharging of the output node 150 drives the cross-coupled PMOS transistor P2 140 into a conductive state, which charges the output node 155 to which the source 194 of the cascode PMOS transistor P4 190, the drain 146 of the cross-coupled PMOS transistors P2 140 and the gate 132 of the cross-coupled PMOS transistor P1 130 are operably coupled to VDDIO 135. This charging of the output node 155 to VDDIO 135 drives the cross-coupled PMOS transistor P1 130 into a non-conductive state. The reverse of the above described operation of the voltage level shifter module circuit 300 occurs when the input 105 comprises a low logical level of 0V.

The voltage level shifter module 300 illustrated in FIG. 3 further comprises a reference voltage control component, the reference voltage control component illustrated in FIG. 3 comprising a transition detector component 310 arranged to receive the input signal 105 and detect logical state transitions within the input signal 105. The transition detector component 310 is further arranged to output a first transition detection signal 312 indicating when a logical state transition from a high logical state to a low logical state (i.e. a falling edge transition) within the input signal 105 has been detected by the transition detector component 310, and a second transition detection signal 314 indicating when a logical state transition from a low logical state to a high logical state (i.e. a rising edge transition) within the input signal 105 has been detected by the transition detector component 310.

Figure 4:
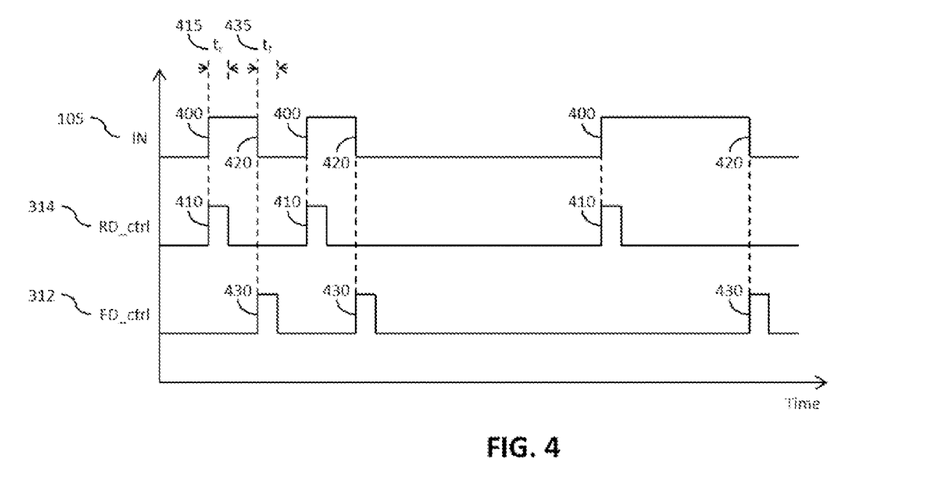
FIG. 4 illustrates a simplified timing diagram of an example of an input signal and transition detection signals.

FIG. 4 illustrates a simplified timing diagram of an example of the input signal 105 and transition detection signals 312, 314. As illustrated in FIG. 4, upon a rising edge in the input signal 105, the transition detection component 310 detects the transition 400 from a low logical level to a high logical level, and generates a pulse 410 on the second transition detection signal 314. In this manner, upon detection of a transition 400 in the input signal 105 from a low logical level to a high logical level, the second transition detection signal 314 changes state from, in the illustrated example, a low voltage level to a high voltage level. After a period of time $t_r$ 415, the second transition detection signal 314 returns to its previous, default, state of a low voltage level. Conversely, upon a falling edge in the input signal 105, the transition detection component 310 detects the transition 420 from a high logical level to a low logical level, and generates a pulse 430 on the first transition detection signal 312. In this manner, upon detection of a transition 430 in the input signal 105 from a high logical level to a low logical level, the first transition detection signal 312 changes state from, in the illustrated example, a low voltage level to a high voltage level. After a period of time $t_f$ 435, the first transition detection signal 312 returns to its previous, default, state of a low voltage level.

Referring back to FIG. 3, in the illustrated example the reference voltage control component further comprises a first reference voltage control circuit 320. The first reference voltage control circuit 320 comprises a resistive element 322 operably coupled between the reference voltage signal VREF_2 185 and the gate 182 of the cascode PMOS transistor P3 180. The first reference voltage control circuit 320 further comprises a switching element, which in the illustrated example comprises an NMOS transistor 324. The switching NMOS transistor 324 is arranged to selectively couple the gate 182 of the cascode PMOS transistor P3 180 to a reduced voltage source, which in the illustrated example comprises the low voltage power supply VSSIO 125. The switching NMOS transistor 324 is further arranged to receive at a gate thereof the second transition detection signal 314 output by the transition detector component 310. In this manner, the switching NMOS transistor 324 is controllable by the second transition detection signal 314 to selectively couple the common node between the resistive element 322 and the gate 182 of the cascode PMOS transistor P3 180 to the reduced voltage source (i.e. the low voltage power supply VSSIO 125 in the illustrated example), causing a voltage drop across the resistive element 322.

When the second transition detection signal 314 is in its default state of a low voltage level, the switching NMOS transistor 324 is in a non-conductive state, effectively isolating the common node between the resistive element 322 and the gate 182 of the cascode PMOS transistor P3 180 from the low voltage power supply VSSIO 125. As such, the first reference voltage control circuit 320 is arranged to apply the reference voltage signal VREF_2 185 to the gate 182 of the cascode PMOS transistors P3 180, via the resistive element 322, substantially without any influence on the reference voltage signal VREF_2 185 at the gate 182 of the cascode PMOS transistors P3 180. Conversely, when the second transition detection signal 314 comprises a high voltage level (i.e. when the transition detection component 310 generates a pulse 410 on the second transition detection signal 314 upon detecting a transition 400 from a low logical level to a high logical level within the input signal 105), the switching NMOS transistor 324 is biased into a conductive state, coupling the common node between the resistive element 322 and the gate 182 of the cascode PMOS transistor P3 180 to the low voltage power supply VSSIO 125. As such, the voltage at the common node between the resistive element 322 and the gate 182 of the cascode PMOS transistors P3 180 is pulled down towards the low voltage power supply VSSIO 125, creating a voltage drop across the resistive element 322. In this manner, upon detection of a transition 400 from a low logical level to a high logical level within the input signal 105, the transition detection component 310 is able to cause the reference voltage applied to the gate 182 of the cascode PMOS transistor P3 180 to be pulled down to a reduced voltage by generating a pulse within the second transition detection signal 314. After a period of time $t_r$ 415, when the second transition detection signal 314 returns to its previous, default, state of a low voltage level, the switching NMOS transistor 324 will return to its non-conductive state, once again isolating the gate 182 of the cascode PMOS transistor P3 180 from the low voltage power supply VSSIO 125, and allowing the voltage at the gate 182 of the cascode PMOS transistor P3 180 to return to the reference voltage signal VREF_2 185.

The reference voltage control component further comprises a second reference voltage control circuit 330. The second reference voltage control circuit 330 comprises a resistive element 332 operably coupled between the reference voltage signal VREF_2 185 and the gate 192 of the cascode PMOS transistor P4 190. The second reference voltage control circuit 330 further comprises a switching element, which in the illustrated example comprises an NMOS transistor 334. The switching NMOS transistor 334 is arranged to selectively couple the gate 192 of the cascode PMOS transistor P4 190 to a reduced voltage source, which in the illustrated example comprises the low voltage power supply VSSIO 125. The switching NMOS transistor 334 is further arranged to receive at a gate thereof the first transition detection signal 312 output by the transition detector component 310. In this manner, the switching NMOS transistor 334 is controllable by the first transition detection signal 312 to selectively couple the common node between the resistive element 332 and the gate 192 of the cascode PMOS transistor P4 190 to the reduced voltage source (i.e. the low voltage power supply VSSIO 125 in the illustrated example, causing a voltage drop across the resistive element 332.

In this manner, when the first transition detection signal 312 is in its default state of a low voltage level, the switching NMOS transistor 334 is in a non-conductive state, effectively isolating the common node between the resistive element 332 and the gate 192 of the cascode PMOS transistor P4 190 from the low voltage power supply VSSIO 125. As such, the second reference voltage control circuit 330 is arranged to apply the reference voltage signal VREF_2 185 to the gate 192 of the cascode PMOS transistors P4 190, via the resistive element 332, substantially without any influence on the reference voltage signal VREF_2 185 at the gate 192 of the cascode PMOS transistors P4 190. Conversely, when the first transition detection signal 312 comprises a high voltage level (i.e. when the transition detection component 310 generates a pulse 430 on the first transition detection signal 312 upon detecting a transition 420 from a high logical level to a low logical level within the input signal 105), the switching NMOS transistor 334 is biased into a conductive state, coupling the common node between the resistive element 332 and the gate 192 of the cascode PMOS transistor P4 190 to the low voltage power supply VSSIO 125. As such, the voltage at the common node between the resistive element 332 and the gate 192 of the cascode PMOS transistors P4 190 is pulled down towards the low voltage power supply VSSIO 125, creating a voltage drop across the resistive element 332. In this manner, upon detection of a transition 420 from a high logical level to a low logical level within the input signal 105, the transition detection component 310 is able to cause the reference voltage applied to the gate 192 of the cascode PMOS transistor P4 190 to be pulled down to a reduced voltage by generating a pulse within the first transition detection signal 312. After a period of time $t_f$ 435, when the first transition detection signal 312 returns to its previous, default, state of a low voltage level, the switching NMOS transistor 334 will return to its non-conductive state, once again isolating the gate 192 of the cascode PMOS transistor P4 190 from the low voltage power supply VSSIO 125, and allowing the voltage at the gate 192 of the cascode PMOS transistor P4 190 to return to the reference voltage signal VREF_2 185.

As previously mentioned, in the case where the input signal 105 transitions from a low logical level of, say, 0V to a high logical level of, say, 2V, the input NMOS transistor N1 110 is driven into a conductive state by the high input signal 105, which pulls the source 164 of the cascode NMOS transistor N3 160 down to VSSIO 125. At the same time, the input NMOS transistor N3 110 is driven into a non-conductive state by the low inverted input signal output by the inverter 115. This results in the source 174 of the cascode NMOS transistor N4 170 charging up to the reference voltage applied to the gate of cascode NMOS transistor N3 160. In the example illustrated in FIG. 3, the gate voltages of the cascode NMOS transistors N3 160, N4 170 are held at VREF_1 165, and so the cascode NMOS transistors N3 160, N4 170 are driven into conductive and non-conductive states respectively. As a result, the drain 186 of the cascode PMOS transistor P3 180 is pulled down to VSSIO 125, whilst the drain 196 of the cascode PMOS transistor P4 190 is charged up to VDDIO 135.

If the gate voltages of the cascode PMOS transistors P3 180, P4 190 are held at VREF_2 185, voltages at the sources 184, 194 of the cascode PMOS transistors P3 180, P4 190 will not drop below VREF_2 185. However, in the example illustrated in FIG. 3, when the input signal 105 transitions from a low logical level to a high logical level, the transition detector component 310 detects the transition 400 and generates a pulse 410 on the second transition detection signal 314. The pulse 410 on the second transition detection signal 314 causes the switching NMOS transistor 324 of the first reference voltage control circuit 320 to operably couple the gate 182 of the cascode PMOS transistor P3 180 to the low voltage power supply VSSIO 125 for a period of time $t_r$ 415. As such, the voltage at the source 184 of the cascode PMOS transistor P3 180 is able to drop down to the reduced voltage level of the low voltage power supply VSSIO 125 for the period of time $t_r$ 415 following the transition of the input signal 105 from a low logical level to a high logical level.

The output node 150 to which the source 184 of cascode PMOS transistor P3 180, the drain 136 of the cross-coupled PMOS transistors P1 130 and the gate 142 of the cross-coupled PMOS transistor P2 140 are operably coupled is discharged until it reaches: $V_{G\_P3}+|V_{Pth}|$, where $V_{G\_P3}$ is the gate voltage for the cascode PMOS transistor P3 180 and $V_{Pth}$ is the threshold voltage for the PMOS transistors.

With a conventional voltage level shifter module circuit such as the voltage level shifter module 100 illustrated in FIG. 1 operating under the minimum permissible voltage for VDDIO 135 of 3.0V, $V_{G\_P3}$=VREF_2=1.5V, with $V_{Pth}$=0.75V. As such, the output node 150 is discharged until it reaches 1.5V+0.75V=2.25V. This 2.25V is applied to the gate 142 of the PMOS transistor P2 140. Since the source 144 of the PMOS transistor P2 140 is tied to VDDIO 135, $V_{GS}$ for the PMOS transistor P2 140=0.75V. Thus, for the conventional voltage level shifter module 100 illustrated in FIG. 1, when VDDIO 135 is 3.0V the voltage applied to the gate 142 of the PMOS transistor P2 140 when the input 105 transitions from 0V to 2V is only sufficient to drive the PMOS transistor P2 140 into its sub-threshold region of operation, with very low drive capability.

By contrast, for the voltage level shifter module circuit illustrated in FIG. 3, upon a transition of the input signal 105 from a low logical level to a high logical level, the voltage at the source 184 of the cascode PMOS transistor P3 180 is able to discharge to the reduced voltage level of the low voltage power supply VSSIO 125 for the period of time $t_r$ 415. As such, during this period of time $t_r$ 415, $V_{G\_P3}$=VSSIO=0V. As such, the output node 150 in the voltage level shifter module circuit 300 of FIG. 3 is discharged until it reaches 0V+0.75V=0.75V. This 0.75V is applied to the gate 142 of the PMOS transistor P2 140. Since the source 144 of the PMOS transistor P2 140 is tied to VDDIO 135, $V_{GS}$ for the PMOS transistor P2 140=3.0V−0.75V=2.25V. Thus, for the voltage level shifter module 300 illustrated in FIG. 3, even when VDDIO 135 is the minimum permissible voltage of 3.0V, the voltage applied to the gate 142 of the PMOS transistor P2 140 when the input 105 transitions from 0V to 2V is sufficient to drive the PMOS transistor P2 140 into its saturation region of operation, with optimum drive capability.

The reverse of the above described operation of the voltage level shifter module circuit 300 occurs when the input 105 comprises a low logical level of 0V. Specifically, when the input signal 105 transitions from a high logical level of, say, 2V to a low logical level of, say, 0V, the input NMOS transistor N2 120 is driven into a conductive state by the high inverted input signal output by the inverter 115, which pulls the source 174 of the cascode NMOS transistor N4 170 down to VSSIO 125. At the same time, the input NMOS transistor N1 110 is driven into a non-conductive state by the low input signal 105. This results in the source 164 of the cascode NMOS transistor N3 160 charging up to the reference voltage applied to the gate of cascode NMOS transistor N3 160. In the example illustrated in FIG. 3, the gate voltages of the cascode NMOS transistors N3 160, N4 170 are held at VREF_1 165, and so the cascode NMOS transistors N3 160, N4 170 are driven into conductive and non-conductive states respectively. As a result, the drain 196 of the cascode PMOS transistor P4 190 is pulled down to VSSIO 125, whilst the drain 186 of the cascode PMOS transistor P3 180 is charged up to VDDIO 135.

In the example illustrated in FIG. 3, when the input signal 105 transitions from a high logical level to a low logical level, the transition detector component 310 detects the transition 420 and generates a pulse 430 on the first transition detection signal 312. The pulse 430 on the first transition detection signal 312 causes the switching NMOS transistor 334 of the second reference voltage control circuit 330 to operably couple the gate 192 of the cascode PMOS transistor P4 190 to the low voltage power supply VSSIO 125 for a period of time $t_f$ 435. As such, the voltage at the source 194 of the cascode PMOS transistor P4 190 is able to drop down to the reduced voltage level of the low voltage power supply VSSIO 125 for the period of time $t_f$ 435 following the transition of the input signal 105 from a high logical level to a low logical level.

The output node 155 to which the source 194 of cascode PMOS transistor P4 190, the drain 146 of the cross-coupled PMOS transistors P2 140 and the gate 132 of the cross-coupled PMOS transistor P1 130 are operably coupled is discharged until it reaches: $V_{G\_P4}+|V_{Pth}|$, where $V_{G\_P4}$ is the gate voltage for the cascode PMOS transistor P4 190.

For the voltage level shifter module circuit illustrated in FIG. 3, upon a transition of the input signal 105 from a high logical level to a low logical level, the voltage at the source 194 of the cascode PMOS transistor P4 190 is able to discharge to the reduced voltage level of the low voltage power supply VSSIO 125 for the period of time $t_f$ 435. As such, during this period of time $t_f$ 435, $V_{G\_P4}$=VSSIO=0V. As such, the output node 155 in the voltage level shifter module circuit 300 of FIG. 3 is discharged until it reaches 0V+0.75V=0.75V. This 0.75V is applied to the gate 132 of the PMOS transistor P1 130. Since the source 134 of the PMOS transistor P1 130 is tied to VDDIO 135, $V_{GS}$ for the PMOS transistor P1 130=3.0V−0.75V=2.25V. Thus, for the voltage level shifter module 300 illustrated in FIG. 3, even when VDDIO 135 is the minimum permissible voltage of 3.0V, the voltage applied to the gate 132 of the PMOS transistor P1 130 when the input 105 transitions from 2V to 0V is sufficient to drive the PMOS transistor P1 130 into its saturation region of operation, with optimum drive capability.

Figure 5:
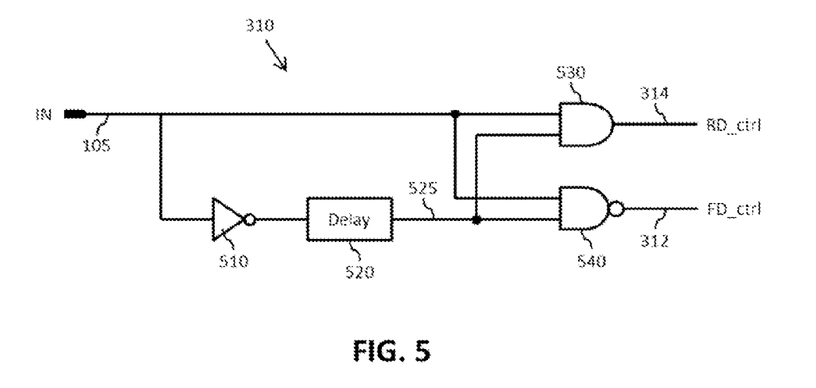
FIG. 5 illustrates a simplified circuit diagram of an example of an implementation of a transition detector component.

Referring now to FIG. 5, there is illustrated a simplified circuit diagram of an example of an implementation of the transition detector component 310. The transition detector component 310 is arranged to receive the input signal 105, which is provided to a first input of an AND gate 530 and a first input of a NAND gate 540. The input signal 105 is also provided to an inverter component 510 and a delay component 520 operably coupled in series to generate an inverted and delayed form 525 of the input signal 105. The inverted and delayed form 525 of the input signal 105 is provided to a second input of the AND gate 530 and a second input of the NAND gate 540. An output of the AND gate 530 provides the second transition detection signal 314, whilst an output of the NAND gate 540 provides the first transition detection signal 312.

Figure 6:
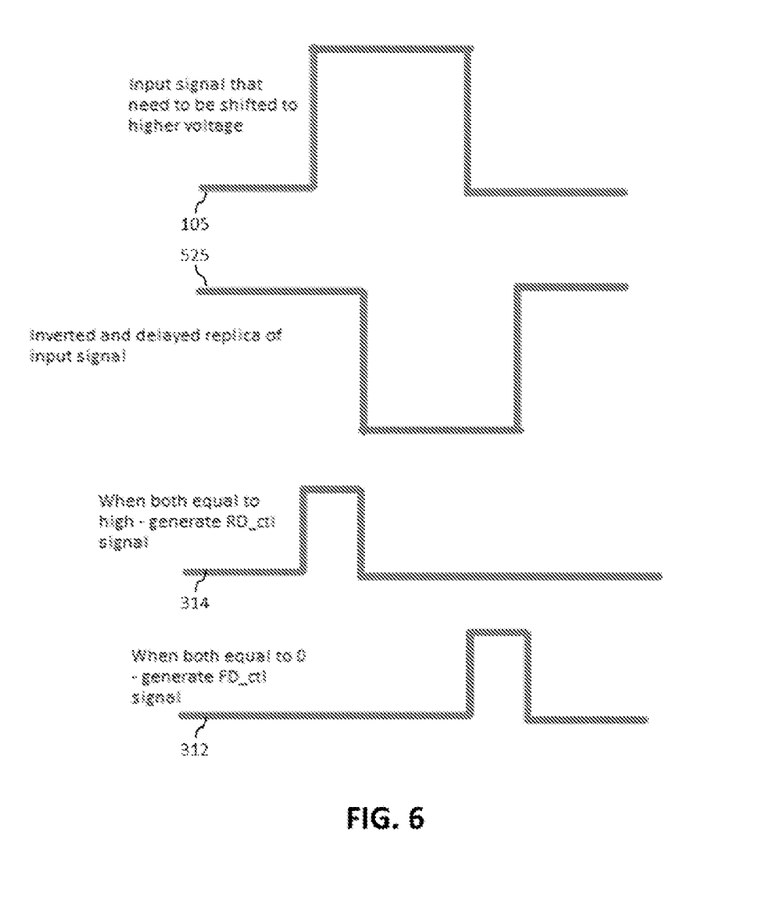
FIG. 6 illustrates a simplified timing diagram illustrating the various signals relating to the transition detector component of FIG. 5.

FIG. 6 illustrates a simplified timing diagram illustrating the various signals relating to the transition detector component 310 of FIG. 5. In particular, the timing diagram of FIG. 6 illustrates the input signal 105, the inverted and delayed form 525 of the input signal 105, and the signals 314, 312 output by the AND and NAND gates 530, 540 respectively. As illustrated in FIG. 6, the AND gate 530 outputs a logical high signal when both the input 105 and the inverted and delayed form 525 of the input signal 105 are both 'high', and a logical low signal otherwise. Accordingly, the AND gate 530 is arranged to output a logical high pulse upon a transition of the input signal 105 from a low logical state to a high logical state (i.e. a rising edge transition). Conversely, the NAND gate 540 outputs a logical high signal when both the input 105 and the inverted and delayed form 525 of the input signal 105 are both 'low', and a logical low signal otherwise. Accordingly, the NAND gate 540 is arranged to output a logical high pulse upon a transition of the input signal 105 from a high logical state to a low logical state (i.e. a falling edge transition). The logical high pulses output by the AND gate 530 and the NAND gate 540 comprise durations of a limited period dependent on the combined delay from the inverter component 510 and the delay component 520. This limited period of time defines the periods of time $t_r$ 415 and $t_f$ 435 after which the transition detection signals 312, 314 return to their previous, default, state of a low voltage level.

Figure 7:
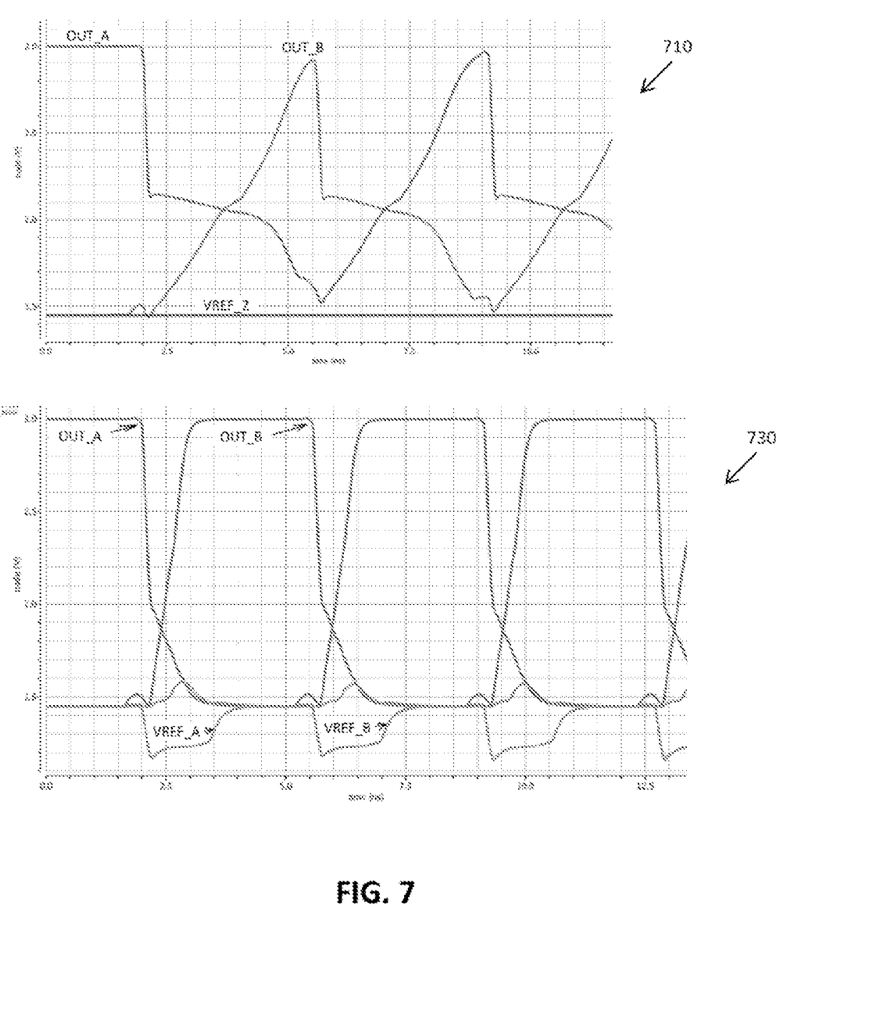
FIG. 7 illustrates a performance comparison between the convention voltage level shifter module illustrated in FIG. 1 and the voltage level shifter module illustrated in FIG. 3.

FIG. 7 illustrates a performance comparison between the conventional voltage level shifter module 100 illustrated in FIG. 1 and the voltage level shifter module 300 illustrated in FIG. 3 when VDDIO 135 is at its minimum permissible voltage of 3.0V. FIG. 7 illustrates a first graph 710 showing the voltage levels at the output nodes 150, 155, and a constant reference voltage VREF_2 185 being applied to the gates of the cascode PMOS transistors P3 180, P4 190 for the conventional voltage level shifter module 100 illustrated in FIG. 1. FIG. 7 further illustrates a second graph 730 showing the voltage levels at the output nodes 150, 155, and the controlled reference voltages being applied to the gates of the cascode PMOS transistors P3 180, P4 190 for the voltage level shifter module 300 illustrated in FIG. 3.

As can be seen from the graphs 710, 730, because the gate voltages of the PMOS transistors P1 130, P2 140 are only sufficient to drive the PMOS transistors P1 130, P2 140 into their sub-threshold region of operation, the time required to drive the output voltages up to VDDIO is relatively long compared with that for the voltage level shifter module 300 illustrated in FIG. 3. As such, the voltage level shifter module 300 is able to achieve optimum performance even when VDDIO 135 is at its minimum permissible voltage of 3.0V.

Figure 8:
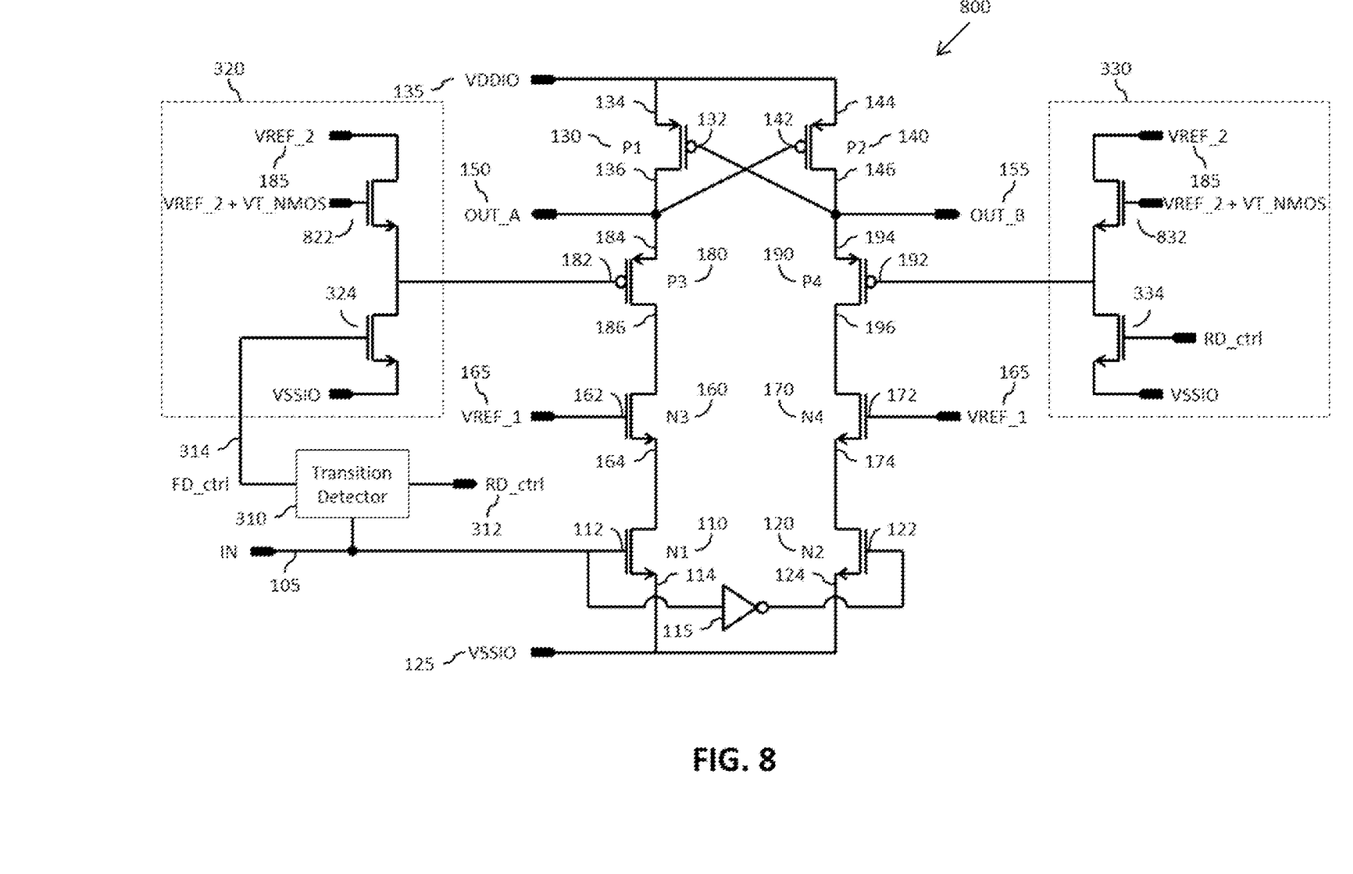
FIG. 8 illustrates a simplified circuit diagram of a further alternative example of a voltage level shifter module.
Figure 9:
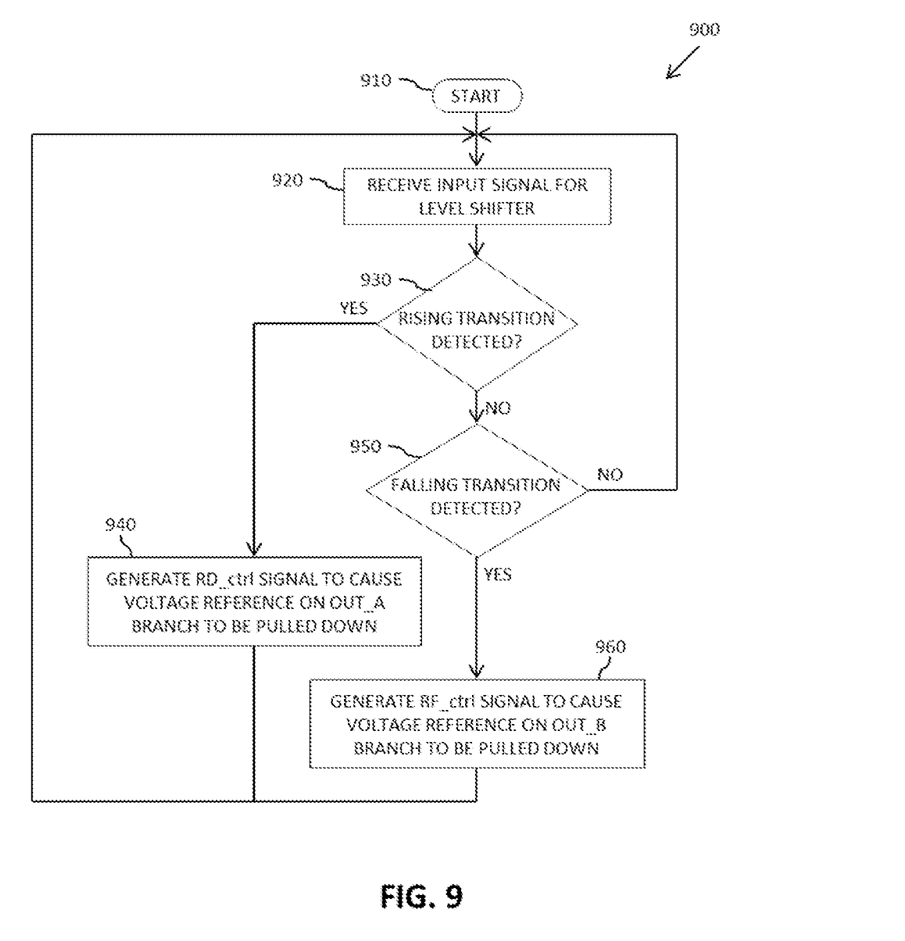
FIG. 9 illustrates a simplified flowchart of an example of a method of controlling reference voltage signals applied to gates of cascode transistors within a voltage level shifter module.

Referring now to FIG. 8, there is illustrated a simplified circuit diagram of an alternative example of a voltage level shifter module 800. The voltage level shifter module 800 in FIG. 3. differs from that of FIG. 8 in that the resistive elements of the first and second reference voltage control circuits 320, 330 comprise N-channel metal oxide field effect transistors 822, 832 respectively. A voltage equal to the reference voltage signal VREF_2 185+$V_{Nth}$, where $V_{Nth}$ is the threshold voltage for the NMOS transistors, is applied to the gates of the NMOS transistors 822, 832 to bias the NMOS transistors 822, 823 into their sub-threshold region of operation. Referring now to FIG. 9, there is illustrated a simplified flowchart 900 of an example of a method of controlling reference voltage signals applied to gates of cascode transistors within a voltage level shifter module, such as may be implemented within the voltage level shifter module of FIGS. 2, 3 and/or 8. The method starts at 910, and moves on to 920 where an input signal for the voltage level shifter module is received. Next, at 930, it is determined whether a rising transition (i.e. a transition from a low logical state to a high logical state) is detected within the received input signal. If it is determined that a rising transition has been detected, the method moves on to 940 where a rising transition detected signal is generated to cause a first reference voltage signal applied to a gate of a cascode transistor to be pulled down to a reduced voltage. The method then loops back to 920. Conversely, if it is determined that a rising transition has not been detected, the method moves on to 950 where it is determined whether a falling transition (i.e. a transition from a high logical state to a low logical state) is detected within the received input signal. If it is determined that a falling transition has been detected, the method moves on to 960 where a falling transition detected signal is generated to cause a second reference voltage signal applied to a gate of a further cascode transistor to be pulled down to a reduced voltage. The method then loops back to 920. Conversely, if it is determined that no transition (rising or falling) has been detected, the method loops back to 920.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps than those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A voltage level shifter module comprising:
at least one input arranged to receive an input signal; and
at least one cascode transistor arranged to receive at a gate thereof at least one reference voltage signal;
wherein the voltage level shifter module further comprises at least one reference voltage control component arranged to:
detect logical state transitions within the input signal from at least a first logical state to a second logical state;
cause the reference voltage signal applied to the gate of the cascode transistor to be pulled down to a reduced voltage upon detection of a logical state transition within the input signal from the first logical state to the second logical state; and
wherein the reference voltage control component includes at least one of,
an AND gate arranged to receive the input signal and an inverted form of the input signal and to output a first logic pulse upon the logical state transition; or a NAND gate arranged to receive the input signal and the inverted form of the input signal and to output a second logic pulse upon the logical state transition.

2. The voltage level shifter module of claim 1, wherein the at least one reference voltage control component is arranged to cause the at least one reference voltage signal applied at the gate of the cascode transistor to be pulled down to a reduced voltage upon detection of a logical state transition within the input signal from at least the first logical state to the second logical state for a limited period of time.

3. The voltage level shifter module of claim 1, wherein the at least one reference voltage control component comprises at least one transition detector component arranged to:
receive the input signal;
detect logical state transitions within the input signal from the first logical state to the second logical state; and
output at least one transition detection signal indicating when the logical state transition within the input signal from the first logical state to the second logical state has been detected.

4. The voltage level shifter module of claim 3, wherein the at least one reference voltage control component further comprises at least one reference voltage control circuit comprising:
at least one resistive element operably coupled between a reference voltage source and the gate of the cascode transistor; and
at least one switching element arranged to selectively couple the gate of the at cascode transistor to a reduced voltage source, the at least one switching element being further arranged to receive that at least one transition detection signal output by the at least one transition detector component and controllable by the at least one transition detection signal to selectively couple the gate of the cascode transistor to a reduced voltage source.

5. The voltage level shifter module of claim 4, wherein the at least one resistive element operably coupled between a reference voltage source and the gate of the cascode transistor comprises an N-channel metal oxide field effect transistor.

6. The voltage level shifter module of claim 5, wherein a voltage equal to the reference voltage source plus a threshold voltage for the N-channel metal oxide field effect transistor is applied to a gate of the N-channel metal oxide field effect transistor.

7. The voltage level shifter module of claim 3, wherein the at least one transition detector component is arranged to generate the inverted and a delayed form of the input signal and includes at least one of:
the AND gate arranged to receive the input signal and the inverted and delayed form of the input signal and to output as a logical high pulse upon a transition of the input signal from a low logical state to a high logical state; or
the NAND gate arranged to receive the input signal and the inverted and delayed form of the input signal and to output as a logical high pulse upon a transition of the input signal from the high logical state to the low logical state.

8. The voltage level shifter module of claim 1, wherein the cascode transistor is a first cascode transistor; wherein the voltage level shifter module comprises a differential voltage level shifter module including:
the first cascode transistor operably coupled within a first branch of the differential voltage level shifter module and arranged to receive at a gate thereof a first reference voltage signal; and
a second cascode transistor operably coupled within a second branch of the differential voltage level shifter module and arranged to receive at a gate thereof a second reference voltage signal,
wherein the at least one reference voltage control component is arranged to:
cause the first reference voltage signal applied at the gate of the first transistor to be pulled down to a reduced voltage upon detection of a logical state transition within the input signal from the first logical state to the second logical state; and
cause the second reference voltage signal applied at the gate of the second cascode transistor to be pulled down to a reduced voltage upon detection of a logical state transition within the input signal from a second logical state to a first logical state.

9. The voltage level shifter module of claim 1 implemented within an integrated circuit device comprising at least one die within a single integrated circuit package.

10. The voltage level shifter module of claim 4, wherein the at least one transition detector component is arranged to generate the inverted and a delayed form of the input signal and comprises at least one of:
the AND gate arranged to receive the input signal and the inverted and delayed form of the input signal and to output as a logical high pulse upon a transition of the input signal from the low logical state to the high logical state; or
the NAND gate arranged to receive the input signal and the inverted and delayed form of the input signal and to output as a logical high pulse upon a transition of the input signal from the high logical state to the low logical state.

11. The voltage level shifter module of claim 5, wherein the at least one transition detector component is arranged to generate the inverted and a delayed form of the input signal and comprises at least one of:
the AND gate arranged to receive the input signal and the inverted and delayed form of the input signal and to output as a logical high pulse upon a transition of the input signal from the low logical state to the a high logical state; or
the NAND gate arranged to receive the input signal and the inverted and delayed form of the input signal and to output as a logical high pulse upon a transition of the input signal from the high logical state to the low logical state.

12. The voltage level shifter module of claim 6, wherein the at least one transition detector component is arranged to generate the inverted and a delayed form of the input signal and comprises at least one of:
the AND gate arranged to receive the input signal and the inverted and delayed form of the input signal and to output as a logical high pulse upon a transition of the input signal from the low logical state to the high logical state; or
the NAND gate arranged to receive the input signal and the inverted and delayed form of the input signal and to output as a logical high pulse upon a transition of the input signal from the high logical state to the low logical state.

13. A method of controlling at least one reference voltage signal applied to a gate of at least one cascode transistor within a voltage level shifter module, the method comprising:
- receiving an input signal of the voltage level shifter module;
- detecting a logical state transition within the input signal of the voltage level shifter module;
- causing the at least one reference voltage signal to be pulled down to a reduced voltage upon detection of a logical state transition with the signal of the voltage level shifter module, and at least one of,
- receiving the input signal and an inverted form of the input signal at an AND gate and outputting a first logic pulse upon the logical state transition; or
- receiving the input signal and the inverted form of the input signal at a NAND gate and outputting a second logic pulse upon the logical state transition.

14. The method of claim 13, wherein the method comprises:
- causing a first reference voltage signal to be pulled down to a reduced voltage upon detection of a logical state transition within the input signal from a first logical state to a second logical state, the first reference voltage being applied at a gate of a first cascode transistor operably coupled within a first branch of a differential voltage level shifter module; and
- causing a second reference voltage signal to be pulled down to a reduced voltage upon detection of a logical state transition within the input signal from the second logical state to the first logical state, the second reference voltage being applied at a gate of a second cascode transistor operably coupled within a second branch of the differential voltage level shifter module.

* * * * *